US005679483A

United States Patent [19]

Maurer

[11] Patent Number: 5,679,483
[45] Date of Patent: Oct. 21, 1997

[54] EMBEDDED PHASE SHIFTING PHOTOMASKS AND METHOD FOR MANUFACTURING SAME

[75] Inventor: Wilhelm Maurer, Hopewell Junction, N.Y.

[73] Assignee: Siemens Aktiengesellschaft, Munich, Germany

[21] Appl. No.: 359,790

[22] Filed: Dec. 20, 1994

[51] Int. Cl.$^6$ .................................. G03F 9/00
[52] U.S. Cl. .................. 430/5; 430/311; 430/322; 430/324
[58] Field of Search .................. 430/5, 311, 322, 430/324; 156/643.1

[56] References Cited

U.S. PATENT DOCUMENTS

| | | | |
|---|---|---|---|
| Re. 31,220 | 4/1983 | Ernsberger | 65/30.13 |
| 4,686,162 | 8/1987 | Stangl et al. | 430/5 |
| 4,902,899 | 2/1990 | Lin et al. | 250/492.1 |
| 5,087,535 | 2/1992 | Hirokane et al. | 430/5 |
| 5,134,015 | 7/1992 | Ohtake et al. | 428/195 |
| 5,208,125 | 5/1993 | Lowrey et al. | 430/5 |
| 5,217,830 | 6/1993 | Lowrey | 430/5 |
| 5,260,150 | 11/1993 | Ohta et al. | 430/5 |
| 5,300,379 | 4/1994 | Dao et al. | 430/5 |

OTHER PUBLICATIONS

Nakajima et al ("Tetenuated phase-shifting mask with a single-layer absorptive shifter of CrO, CrON, MoSiO and MoSiON film", SPIE Meeting Mar. 27, 1994, Paper No. 2197-10).

*Primary Examiner*—S. Rosasco
*Attorney, Agent, or Firm*—Dexter K. Chin

[57] ABSTRACT

The present invention phase shifting photomask is fabricated by means of a structured modification to the surface of a mask blank suitable for photolithography. Ion implantation, diffusion or similar processes are used to alter the optical properties of selected areas of a mask blank in such a way that these areas modify the intensity and phase of optical radiation transmitted through the processed areas of the mask blank substrate. The present invention provides the intended phase and intensity modulation by modification of a surface layer or other layer which is close to the surface of the mask blank. This leaves the actual surface of the mask blank intact and smooth without chemical changes to the surface of the mask blank. In this way optical radiation is not scattered on the borders of different materials and unwanted particulates will have a lower chance of adhering to a smooth surface with little or no topography. Use of photomasks manufactured in accordance with the present invention method enhances the resolution and process window, for example, depth of focus and/or exposure latitude of the lithographic process.

22 Claims, 2 Drawing Sheets

EMBEDDED PHASE SHIFTING PHOTOMASKS AND METHOD FOR MANUFACTURING SAME

FIELD OF THE INVENTION

The present invention relates to the field of semiconductor manufacture and more particularly to a phase shifting photomask for use in photolithography.

BACKGROUND OF THE INVENTION

In the fabrication of integrated circuits including semiconductor integrated circuit chips, one of the most critical and crucial steps is the lithographic processing for providing a desired circuit pattern. State of the art semiconductor devices require very small dimensional patterns in order to accomplish the high density of device packing required by the industry today. The requirement of small dimensional patterns with close spacing between adjacent features requires high resolution photolithographic processes.

In general, photolithography utilizes a beam of light, such as ultraviolet (UV) waves, to transfer a pattern from a photolithographic mask onto a photoresist coating through an imaging lens. The mask includes opaque and transparent regions such that the shapes in the openings of the photoresist match a desired predetermined pattern.

One technique currently being used for improving the resolution of the photolithographic process is known as phase shifting lithography. With phase shift lithography the interference of light rays is used to overcome diffraction and improve the resolution and depth of focus of optical images projected onto a target. In phase shift lithography, the phase of the exposure light at an object is controlled such that the adjacent areas are formed preferably 180° out of phase with one another. Thus, the contrast at the border of those areas is enhanced, even when diffraction would have otherwise caused the contrast to degrade. This technique improves total resolution at the object and allows for very fine resolutions to occur.

To take advantage of the benefits offered by this phase shifting technique, phase shifting masks have been widely used to enhance the processes of optical lithography. Currently, there are four major types of phase shift masks (with countless subtypes):

Alternating phase shift masks, where the phase difference is between adjacent openings in a photomask. These openings are separated by regions of opaque material. Alternating phase shift masks have special design constraints, since the contrast enhancement works only between areas being preferably 180° out of phase with each other.

Shifter only or phase edge shift masks, where the pattern to be enhanced is defined by the border between openings being preferably 180° out of phase with each other without any absorbing areas in between. The 180° phase step prints (for example into positive resist) a dark line. The width of that line is given by the optical and process parameters of the equipment used. Special design strategies have to be applied to generate lines of different width on the same exposure.

Rim phase shift masks, where a preferably 180° phase step at the edge of an opening is formed. This phase step enhances the contrast at the border of that opening. In this type of phase shift mask, the distance between the phase step and the edge of the opening is very critical. In general, for every opening size, a different distance is optimum.

Embedded phase shift masks, where the pattern to be printed is defined by openings in an absorbing layer—similar to conventional (binary) photomasks. Contrary to conventional photomasks, the absorbing layer does not absorb all radiation used in the printing process completely, but transmits a defined amount of that radiation (typically in the range between 3% and 20%). Between the radiation transmitted through the absorber and the radiation transmitted by the mask openings is a phase shift of preferably 180°. This phase shift enhances the contrast at the pattern edge. Besides much simpler manufacturing, embedded phase shift masks can be designed using the same routines and manufactured using the same design data as conventional photomasks (one layer only). The only correction necessary is a difference in the size of the openings (bias). Because of these advantages, embedded phase shift masks are by far closest to be used in high volume production of semiconductor devices.

Two main methods of manufacturing an embedded phase shifter mask are currently used. A first method uses an absorbing layer on a mask blank to modify the intensity of the optical radiation, and another layer that is either etched into the mask blank or deposited onto the mask blank to modify the phase of the optical radiation. A second method combines both the intensity modulation and the phase shifting into a single layer. Both of these methods, however, generate a non-uniform surface topography on the final photomask.

This non-uniform surface topography may scatter the optical radiation in a way that some or all of the advantages of using such a phase shift mask are lost. In addition, non-uniform surface topography and the fact that multiple layers of different materials are deposited on the mask may lead to problems at mask cleaning. That is, unwanted particulates have a higher chance to adhere, and adhere with a higher force on an uneven surface topography. Also, the layers of different materials can restrict the use of efficient cleaning procedures and chemicals.

Accordingly, in order for phase shifting techniques to be adopted on a large scale, the process must be compatible with existing manufacturing conditions, that is, these processes must be inexpensive, repetitive and clean.

It is therefore an object of the present invention to provide an embedded phase shifting photomask and method for manufacturing such a mask that allows the surface topography of the mask blank to be left intact and smooth and free from non-uniformities while still taking advantage of phase shift lithography techniques. It is further an object of the present invention to produce a phase shifting photomask with a smooth surface such that unwanted particulates have a lower chance of adhering thereto with lower binding forces in order to produce masks with lower defect density that are easier to clean than other masks of that kind.

SUMMARY OF THE INVENTION

The present invention phase shifting photomask is fabricated by means of a structured modification to the surface of a mask blank suitable for photolithography. Ion implantation, diffusion or similar processes are used to alter the optical properties of selected areas of a mask blank in such a way that these areas modify the intensity and phase of optical radiation transmitted through the processed areas of the mask blank substrate relative to the unprocessed areas. Use of photomasks manufactured in accordance with the present invention method enhances the resolution and process window, for example, depth of focus and/or exposure latitude of the lithographic process.

The present invention provides the intended phase and intensity modulation by modification of a surface layer or other layer which is close to the surface of the mask blank. This leaves the actual surface of the mask blank intact and smooth without chemical changes to the surface of the mask blank. In this way optical radiation is not scattered on the borders of different materials, and unwanted particulates will have a lower chance of adhering to a smooth surface with little or no topography. If particulates do adhere on such a surface, they will adhere with lower binding forces that enables easier cleaning. It is therefore possible to produce masks with lower defect density, that are easier to clean than other prior art phase shift masks. Since the chemical characteristics of the mask surface of the present invention phase shifting photomask remain essentially unchanged, a finished phase shifting mask produced by the described method may be cleaned using the same harsh procedures that are used to clean mask blanks before material deposition, such as, oxidizing hot sulfuric acid, etc.

BRIEF DESCRIPTION OF THE FIGURES

For a better understanding of the present invention, reference may be made to the following descriptions of exemplary embodiments thereof, considered in conjunction with the accompanying drawings, in which.

DETAILED DESCRIPTION OF THE DRAWINGS

The present invention is an embedded phase shifting photomask wherein the substrate of a mask blank is modified in such a way that the surface topography of the substrate remains essentially unchanged. Modification can take place by means of ion implantation or diffusion which allows the masks to be produced with a lower defect density while at the same time being easier to clean than other finished masks of that kind.

Figure 1A:
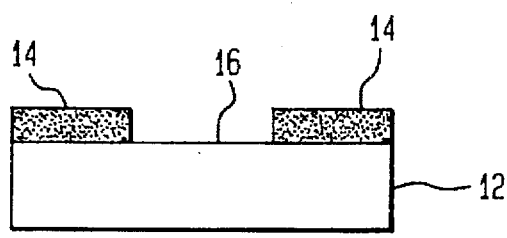
FIG. 1A illustrates a first step in fabrication of the present invention embedded phase shifting photomask.

Referring to FIG. 1A, there is shown a mask blank 12, which is processed in accordance with the present embedded phase shifting photomask invention. In a preferred embodiment of the invention the mask blank 12 will be formed from a substantially transparent substrate such as quartz. Quartz is a highly purified glass having optical properties suitable for use in photolithography. Quartz is also well known for other characteristics which prove useful in semiconductor manufacturing, such as inherent stability at high temperatures, cleanliness, as well as ease of being cleaned. Quartz is also highly transparent in the UV (ultraviolet) region and, therefore, is typically utilized as a mask material in systems using photolithography. It will be understood, however, that the mask blank 12 may be formed of any other suitable material having the desired optical and mechanical characteristics used in photolithography.

A masking layer 14, as shown in FIG. 1A, is applied to the mask blank 12 in areas which are to retain their original optical properties. That is, the masking layer 14 be coated or patterned onto the substrate using techniques which are known in the art, such as electron-beam writing or laser patterning in order to delineate the necessary circuit pattern. As can be seen the masking layer 14 is deposited on either side of the mask blank 12 leaving a well, or exposed region 16. The material used for the masking layer 14 may be a photoresist, dielectric or metallic layer depending on the methodology used to modify the mask blank 12. For example, a photoresist may be used as a masking layer for ion implantation and a dielectric or metallic layer may be used for ion implantation or diffusion at elevated temperatures. It will be understood that the masking layer will be selectively applied to the mask blank 12 to leave multiple masked and exposed regions representative of the desired circuit pattern.

Figure 1B:
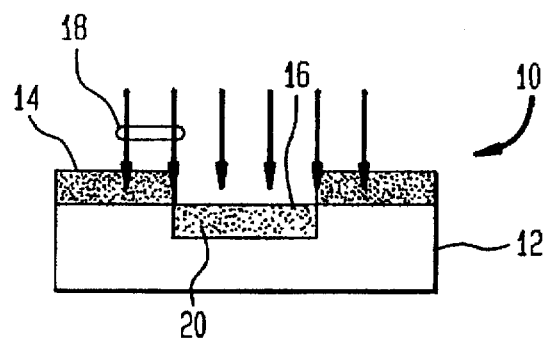
FIG. 1B shows an intermediate step in the production of the present invention phase shifting photomask.

Referring to FIG. 1B, there is shown an intermediate representation of the present invention embedded phase shifting photomask 10. The selectively masked blank substrate 12 is shown to be processed wherein the exposed region 16 is modified to alter the optical characteristics of the selected regions of the mask blank left unmasked. Modification of the mask blank 12 can be accomplished by means of ion implantation or diffusion, as will be explained. In ion implantation, the mask blank 12 is subjected to high voltage ion bombardment with ion dopants 18. The ion dopants form a modified area 20 in the exposed region 16 between the masking layer 14. The modified area 20 functions to alter the optical characteristics of the mask blank 12, wherein light transmitted through the modified regions will experience a phase shift and absorption relative to the unaffected areas of the substrate.

Ion implantation processes are well known in the art of semiconductor manufacturing. In general, ion implantation forms a specific concentration and distribution of dopant atoms in a selected region of a substrate. This alters the chemical structure and physical characteristics of the substrate or mask blank 12 in the ion implant area. In a preferred embodiment of the invention the dopant concentration and distribution achieves a change in the index of refraction of the mask blank 12 to provide a 180° phase shift at the wavelength of exposure and a transmission loss of 4% to 20% (due either to absorption or reflection) at the wavelength of exposure.

The modification of the mask blank substrate 12 may also be carried out by means of a diffusion process. The diffusion process is a widely used method of introducing a controlled amount of impurity into a substrate. Essentially, there are two types of diffusion processes used in semiconductor manufacturing, i.e., constant-source diffusion and limited-source or Gaussian diffusion. In constant-source diffusion the impurity or dopant concentration at the substrate surface is maintained at a constant level throughout the diffusion cycle. The constant impurity level on the surface is determined by the temperature and the carrier-gas flow rate of the diffusion furnace. In most continuous diffusion systems, it is convenient to let the surface concentration of the impurity dopant be determined by the solid-solubility concentration limit of the particular dopant in the substrate. In limited-source or Gaussian diffusion, the total amount of impurity introduced into the substrate during diffusion is limited. This is achieved by depositing a fixed number of impurity atoms per unit of exposed surface area of the substrate during a short "predeposition" step before the actual diffusion. This predeposition cycle is then followed by a "drive-in cycle", where the impurity already deposited during the predeposition step is diffused into the substrate. Each of these diffusion processes changes the optical characteristics and refractive index of the substrate as with the ion implantation.

The change in the refractive index in the modified area 20 may be achieved by closely controlling the ion implantation process and diffusion processes by techniques that are known in the art. By closely controlling the process parameters, such as, implantation energy, annealing procedures and diffusion temperatures, the intended phase and intensity modulation can be achieved in a surface portion or portion that is close to the surface of the substrate, while at the same time leaving the actual surface of the mask blank intact and smooth. The implantation and diffusion may be performed on suitable ion implantation and diffusion equipment used in the semiconductor manufacturing industry. The dopant ions and (impurity) atoms may be any suitable substances which modify the optical characteristics of the mask blank substrate 12, such as for example, Boron and Phosphorus. Other dopant materials may include, but are not limited to Aluminum, Gallium, Indium, Arsenic and Antimony.

Figure 1C:
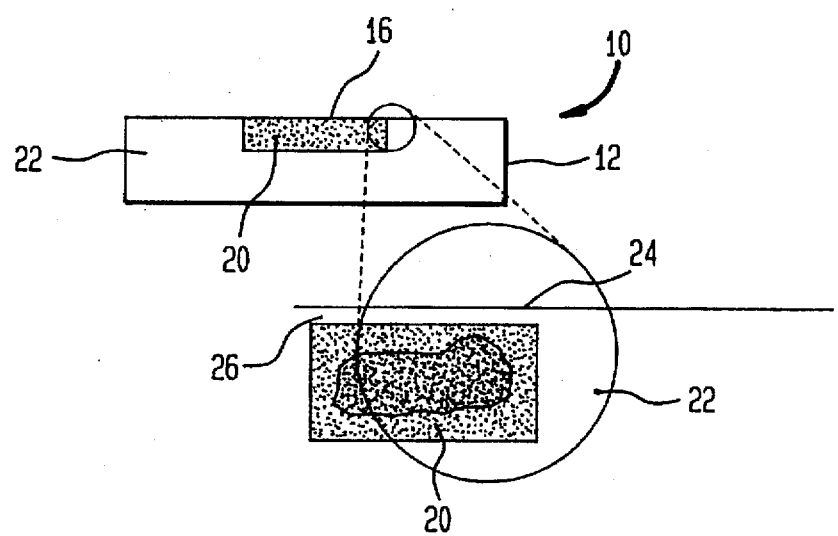
FIG. 1C shows a final step in the manufacturing process and illustrates a first preferred embodiment of the present invention phase shifting photomask.

Referring to FIG. 1C, there is shown a final representation of the present invention embedded phase shifting photomask 10. The completed phase shifting photomask 10 has the masking layer 14 stripped away from the mask blank 12. After stripping the mask layer 14, the mask blank 12 consists of an unmodified area 22 and the modified area 20. Referring to the enlarged detail area of FIG. 1C, it can be seen that by carefully controlling the process parameters of the ion implantation, diffusion, or other process, it is possible to get an unchanged surface 24 of the mask blank 12 even within the exposed process area 16. Thus, the modified area 20 actually becomes embedded underneath the surface 24 of the mask blank 12, leaving a small unmodified region 26 between the surface 24 of the mask blank 12 and the modified area 16. The depth of this surface volume can be shallow enough not to alter the optical properties of the mask 12, but deep enough to expose only blank material to the surrounding environment. Proper control of the process parameters, i.e., diffusion temperatures, implantation strategies and/or annealing procedures, also allows the transition areas between the modified area 20 and unmodified areas 22 of the mask blank 12 to be tailored to minimize parasitical effects.

By producing a phase shift mask wherein the modified phase shifting region 20 is actually embedded underneath the surface of the mask blank substrate 12, the surface topography of the mask will be essentially unchanged and remain smooth. In this way optical radiation is not scattered on the borders of different materials and unwanted particulates will have a lower chance of adhering to a smooth surface with little or no topography. If particulates do adhere on such a surface, they will adhere with lower binding forces that enables easier cleaning. It is therefore possible to produce masks with lower defect density, that are easier to clean than other prior art phase shift masks. Since the surface 24 of the present invention phase shifting photomask 10 essentially retains the chemical properties of the mask blank 12 above the modified area 20, a finished phase shifting mask produced by the described method may be cleaned using the same harsh procedures that are used to clean mask blanks 12 before material deposition, such as, oxidizing hot sulfuric acid. Accordingly, the manufacturing efficiency is increased, since the mask blanks may be cleaned more easily and more thoroughly.

It will be understood that the modified areas 20 of the mask blank 12 are characterized by an index of refraction that is different from the index of refraction of the mask blank substrate 12 and characterized by an optical transmission that is different from the optical transmission of the mask blank substrate. Preferably, the relative difference in the index of refraction provides a phase shift of 180° between the light passing through a modified region 20 and light passing through any other portion of the transparent mask blank 12. Preferably, the optical transmission of the modified area 20 is 4% to 20% of the optical transmission of any other portion of the transparent mask blank 12. These phase shifting masks enhance resolution and the depth of focus and/or exposure latitude of the lithographic process.

Figure 2:
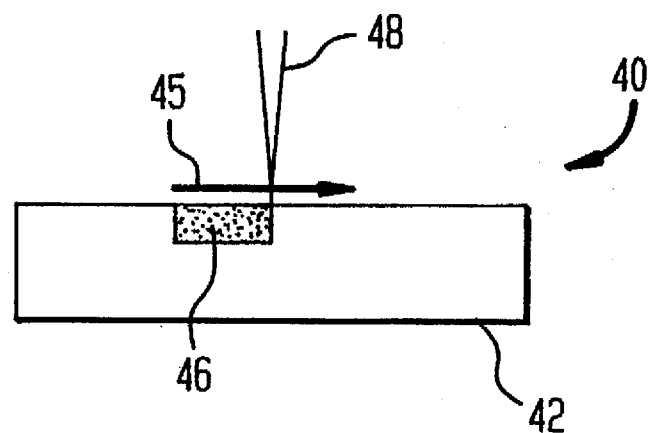
FIG. 2 shows a second preferred embodiment and techniques for manufacturing the present invention phase shifting photomask.

Referring to FIG. 2, there is shown a second preferred embodiment of an embedded phase shifting photomask 40, which is manufactured in accordance with the present invention. The photomask 40 includes a mask blank 42 and a modified area 46, wherein the modified area 46 is produced by exposure of the substrate to an incoming scanning ion beam 48. Thus, the surface of the mask blank 42 is modified by scanning a focused beam of ions over the areas intended to be modified. As can be seen with reference to FIG. 2, the ion beam is initially focused at the start of the modified area 45 and is gradually transitioned across the area to be modified until a desired patterned area is implanted with ions. By using a precision focused ion beam 48 to accurately modify the optical characteristics of the mask blank at selected areas, it is possible to eliminate the step of masking the substrate prior to the performance of ion implantation. This reduces the manufacturing steps involved in mask production which can result in a significant savings.

Figure 3:
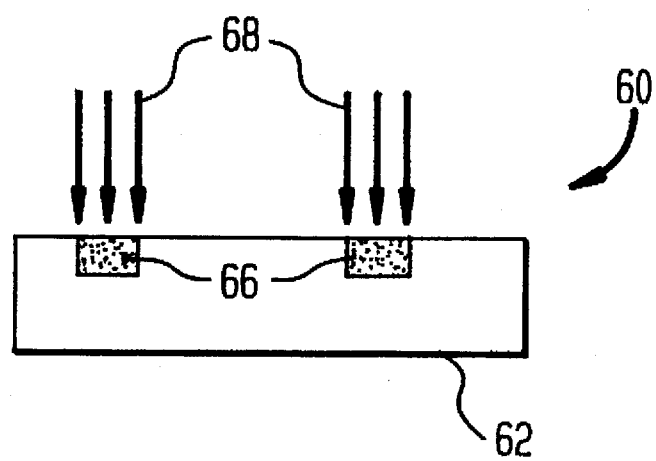
FIG. 3 shows a second preferred embodiment and techniques for manufacturing the present invention phase shifting photomask.

Referring to FIG. 3, there is shown a third preferred embodiment of an embedded phase shifting photomask 60 made in accordance with the techniques of the present invention. As with the embodiment of FIG. 2, the photomask 60 includes a mask blank 62 and modified areas 66, however, in this case the modified areas are produced by means of an incoming patterned ion beam 68. The patterned ion beam can be either a masked ion beam or a beam produced by ion projection. In either case the patterned ion beam allows accurate implantation of ions into selected areas of the mask blank 62 and use thereof may also eliminate the step of masking prior to implantation of the ions.

Referring to FIGS. 2 and 3, it will be understood that by once again optimizing the process parameters (implantation energy, annealing procedures, etc.) the modified areas 46,66 can be placed at a shallow depth below the surface of the mask blank, as was described with reference to FIG. 1C. This essentially leaves the processed surface of the mask unchanged, producing significant advantages over the prior art as have been explained. It will also be understood that depending on the application, it may be necessary to mask the blank substrate 42,62 prior to ion implantation as has been previously described.

From the above, it should be understood that the embodiment described, in regard to the drawings, is merely exemplary and that a person skilled in the art may make variations and modifications to the shown embodiment without departing from the spirit and scope of the invention. All such variations and modifications are intended to be included within the scope of the invention as defined in the appended claims.

What is claimed is:

1. A method of producing a phase shifting photomask for use in optical lithography, said method including the steps of:

providing a mask blank for use in photolithography;

masking selected portions of said mask blank with a mask layer to form a pattern of exposed and unexposed regions on the surface of said mask blank;

introducing a substance into an area immediately underneath the surface of each of said exposed regions of said mask blank to alter the optical properties of each of said areas while the chemical properties of said surface of said mask blank remain unchanged wherein light transmitted through said mask blank will experience a phase shift and absorption only in the location of each of said exposed regions; and stripping away said mask layer, thereby leaving a consistently smooth and homogeneous surface on said mask blank which is void of any topographical imperfections.

2. The method of claim 1, wherein each of said areas comprises an embedded region of phase shifting material underneath the surface of said mask blank at said exposed regions.

3. The method of claim 1, wherein said step of introducing includes ion implantation from selected dopants.

4. The method of claim 3, wherein said ion implantation is accomplished by means of an ion scanning beam.

5. The method of claim 3, wherein said ion implantation is accomplished by means of a patterned ion beam.

6. The method of claim 1, wherein said step of introducing includes the step of diffusing atoms into said areas of said mask blank.

7. The method of claim 1, wherein said mask blank is comprised of quartz.

8. The method of claim 1, wherein said substances introduced into said mask blank are selected from the group consisting of Boron, Phosphorus, Aluminum, Gallium, Indium, Arsenic and Antimony.

9. The method of claim 1, wherein said exposed regions of said mask blank produce a phase shift in optical radiation of 180° and a transmission loss of between 4% and 20% relative said unexposed regions.

10. A method of producing a phase shifting photomask for use in optical lithography, said method including the steps of:

providing a mask blank substrate for use in photolithography;

implanting ions from a dopant into selected regions underneath a surface of said substrate in order to alter the optical properties of said selected regions while the chemical properties of said surface of said mask blank substrate remain unchanged such that the intensity and phase of optical radiation transmitted through said regions is modified relative to other areas of said substrate.

11. The method of claim 10, wherein said step of implanting ions produces an embedded region of modified material underneath the surface of said mask blank at said selected regions, wherein the chemical properties of said surface of said substrate remain unchanged.

12. The method of claim 10, wherein said ion implantation is accomplished by means of an ion scanning beam.

13. The method of claim 10, wherein said ion implantation is accomplished by means of a patterned ion beam.

14. The method of claim 10, wherein said selected regions of said mask blank produce a phase shift in optical radiation of 180° and a transmission loss of between 4% and 20% relative said other areas of said substrate.

15. The photomask of claim 10, wherein said modified regions of said substrate produce a phase shift in optical radiation of 180° and a transmission loss of between 4% and 20% relative said unmodified regions of said substrate.

16. A phase shifting photomask for use in optical lithography, said photomask comprising:

a transparent substrate being of a first index of refraction, said substrate including selected regions embedded underneath a top surface thereof, said selected regions being of a second index of refraction that is substantially different than said first index of refraction, wherein the intensity and phase of optical radiation transmitted through said substrate is altered only in said selected regions of said substrate.

17. The photomask of claim 16, wherein the chemical properties of said surface of said mask substrate remain unchanged, thereby leaving a consistently smooth surface on said top surface of said substrate which is void of any topographical imperfections.

18. The photomask of claim 16, wherein said selected regions were changed from said first index of refraction to said second index of refraction by structurally modifying said selected regions by introducing a substance into said substrate.

19. The photomask of claim 18, wherein said substance introduced into said substrate is selected form the group consisting of Boron, Aluminum, Gallium, Indium, Arsenic and Antimony.

20. The photomask of claim 18, wherein introduction of said substance is accomplished by means of ion implantation.

21. The photomask of claim 18, wherein introduction of said substance is accomplished by means of diffusion.

22. The photomask of claim 16, wherein said substrate is quartz.

* * * * *